United States Patent
Koo et al.

(10) Patent No.: US 7,557,391 B2
(45) Date of Patent: Jul. 7, 2009

(54) ORGANIC LIGHT-EMITTING DISPLAY DEVICE

(75) Inventors: Young-Mo Koo, Suwon-si (KR); Ok-Keun Song, Suwon-si (KR); Hye-In Jeong, Suwon-si (KR); Tae-Shick Kim, Suwon-si (KR); Jae-Goo Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 163 days.

(21) Appl. No.: 11/755,095

(22) Filed: May 30, 2007

(65) Prior Publication Data

US 2007/0295959 A1    Dec. 27, 2007

(30) Foreign Application Priority Data

Jun. 7, 2006    (KR) ..................... 10-2006-0050868

(51) Int. Cl.
*H01L 51/50* (2006.01)
(52) U.S. Cl. .................. 257/232; 257/79; 257/431; 257/749; 257/E51.001; 257/E51.018
(58) Field of Classification Search ............ 257/79–93, 257/232, 431–432, 749, E51.001, E51.018
See application file for complete search history.

(56) References Cited

U.S. PATENT DOCUMENTS

2005/0012094 A1*  1/2005  Park ........................... 257/40
2006/0204788 A1*  9/2006  Yoshikawa .................. 428/690

* cited by examiner

*Primary Examiner*—Cuong Q Nguyen
*Assistant Examiner*—Cathy N Lam
(74) *Attorney, Agent, or Firm*—Stein McEwen, LLP

(57) ABSTRACT

An organic light-emitting display device wherein an IR drop across a first electrode can be prevented. The organic light-emitting display device includes a substrate; a plurality of stripe-shaped first electrodes disposed on the substrate and extending in a first direction; a plurality of stripe-shaped first insulators extending in a second direction to cross the stripe-shaped first electrodes; a plurality of stripe-shaped second electrodes disposed between the stripe-shaped first insulators to extend in the same direction as the stripe-shaped first insulators and cross the stripe-shaped first electrodes; an intermediate layer disposed at positions where the stripe-shaped first electrodes and the stripe-shaped second electrodes cross and including an emission layer; and first conductors disposed at positions where the stripe-shaped first electrodes and the stripe-shaped first insulators intersect and between the stripe-shaped first electrodes and the stripe-shaped first insulators.

20 Claims, 3 Drawing Sheets

ORGANIC LIGHT-EMITTING DISPLAY DEVICE

CROSS-REFERENCE TO RELATED PATENT APPLICATIONS

This application claims the benefit of Korean Patent Application No. 2006-50868, filed Jun. 7, 2006, in the Korean Intellectual Property Office, the disclosure of which is incorporated herein in its entirety by reference.

BACKGROUND OF THE INVENTION

1. Field of the Invention

Aspects of the present invention relate to an organic light-emitting display device, and more particularly to an organic light-emitting display device wherein an IR drop (voltage drop) across first electrodes is prevented.

2. Description of the Related Art

Various flat panel display devices including passive matrix organic light-emitting display devices have recently been developed to meet the need for slimmer and larger-screen display devices. An example image display unit 20 of a passive matrix organic light-emitting display device is shown in FIG. 1.

Referring to FIG. 1, the image display unit 20 includes stripe-shaped first electrodes 21 extending in a Y direction, stripe-shaped second electrodes 22 extending in an X direction to cross the stripe-shaped first electrodes 21, and an intermediate layer 24 disposed between the first electrodes 21 and the second electrodes 22. As shown in FIG. 1, the intermediate layer 24 is disposed to cover the first electrodes 21; and, the second electrodes 22 are disposed on the intermediate layer 24. The intermediate layer 24 includes at least an emission layer in which holes combine with electrons to generate light. The first and second electrodes 21 and 22 intersect to form pixels, which are arranged to emit light and form images. The holes are supplied to the intermediate layer 24 from one of the first electrodes 21 and the second electrodes 22, and the electrons are supplied to the intermediate layer 24 by the other of the first electrodes 21 and the second electrodes 22.

As described in connection with FIG. 1, the passive matrix organic light-emitting display device includes stripe-shaped electrodes. Methods of forming stripe-shaped electrodes include a method using deposition on an entire surface and lithography, an ink jet printing method, a deposition method using a mask, and the like. However, the method using deposition on an entire surface and lithography involves complex processes, such as deposition, photoresist coating, patterning, and etching, etc. Furthermore, the intermediate layer 24 may be damaged during the formation of the stripe-shaped second electrodes 22, which are formed after and on the intermediate layer 24. In contrast, the ink jet printing method is time consuming when applied to a large area.

To address these and/or other problems, a method using a separator has been suggested. FIG. 2 is a sectional view schematically illustrating a portion of a conventional organic light-emitting display device in which second electrodes 22 are formed to be stripe-shaped using second electrode separators 31.

Referring to FIG. 2, stripe-shaped first electrodes 21 are formed on a substrate 10 using a conventional method to extend in a first direction, i.e., a Y direction. And, the second electrode separators 31 are formed to extend in a second direction, i.e., an X direction, and to cross the stripe-shaped first electrodes 21. Next, an intermediate layer 24 is formed to cover the first electrodes 21. Then, the second electrodes 22 are formed on the entire surface of the intermediate layer 24. During application of the intermediate layer 24 and the second electrodes 22, a portion 24a of the intermediate layer 24 and a portion 22a of the second electrodes 22 are formed on the second electrode separators 31. So, when forming the second electrodes 22 on the entire surface of the intermediate layer 24, a portion 22a, which is the same as the material used to form the second electrodes 22, is also deposited on the upper surface of the second electrode separators 31. As the portion 22a of the second electrodes 22 is physically separated from the second electrodes 22 by the height of the second electrode separators 31 and because the portion 22a does not contact the second electrodes 22, the second electrodes 22 are accordingly formed to be stripe-shaped. A portion of the intermediate layer 24 can also be formed by deposition and the material forming the intermediate layer 24 can be deposited on the upper surface of the second electrode separators 31 (referring to the portion 24a).

However, the stripe-shaped first electrodes 21 have a high electrical resistance when they are formed of a transparent material. In particular, the IR drop across the stripe-shaped first electrodes 21 increases as the size of a screen of the organic light-emitting display device and brightness are increased. Thus, organic light-emitting display devices suffer from problems such as increased power consumption and reduced life span.

SUMMARY OF THE INVENTION

Several aspects and example embodiments of the present invention provide an organic light-emitting display device wherein an IR drop (voltage drop) across first electrodes is prevented.

In accordance with an example embodiment of the present invention, there is provided an organic light-emitting display device including: a substrate; first electrodes disposed on the substrate and extending in a first direction; first insulators extending in a second direction to cross the first electrodes; second electrodes disposed between the first insulators to extend in the same direction as the first insulators and cross the first electrodes; an intermediate layer disposed at positions between the first electrodes and the second electrodes where the first and second electrodes cross and including an emission layer; and first conductors disposed at positions where the first electrodes and the first insulators cross and disposed between the first electrodes and the first insulators.

According to an aspect of the present invention, the first conductors can be formed of Cr, Mg, Ag, Mo, MoW or Al. A terminal unit can further included in edges of the substrate. Terminals of the terminal unit can be formed of the same material as the first conductors. The terminals of the terminal unit can have a multi-layer structure including at least two layers. The terminals of the terminal unit can include a first layer which is formed of the same material as the first electrodes and a second layer which is formed of the same material as the first conductors.

According to an aspect of the present invention, the first insulators can be formed so as to cover the first conductors. Second insulators are disposed between the first electrodes can further be included. The first insulators and the stripe-shaped second insulators can be integrally formed as one body. The first electrodes can be transparent electrodes. The first electrodes can be formed of ITO, IZO, ZnO or $In_2O_3$. Second conductors can further be included disposed on the first insulators wherein the second conductors are formed of the same material as the second electrodes.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
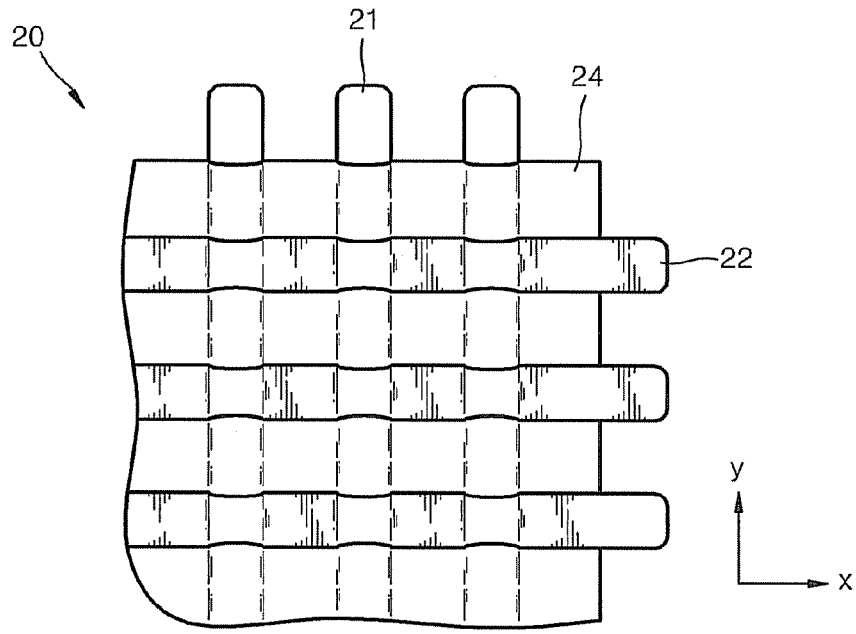
FIG. 1 is a schematic plan view illustrating an image display unit of a conventional organic light-emitting display device.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 3:
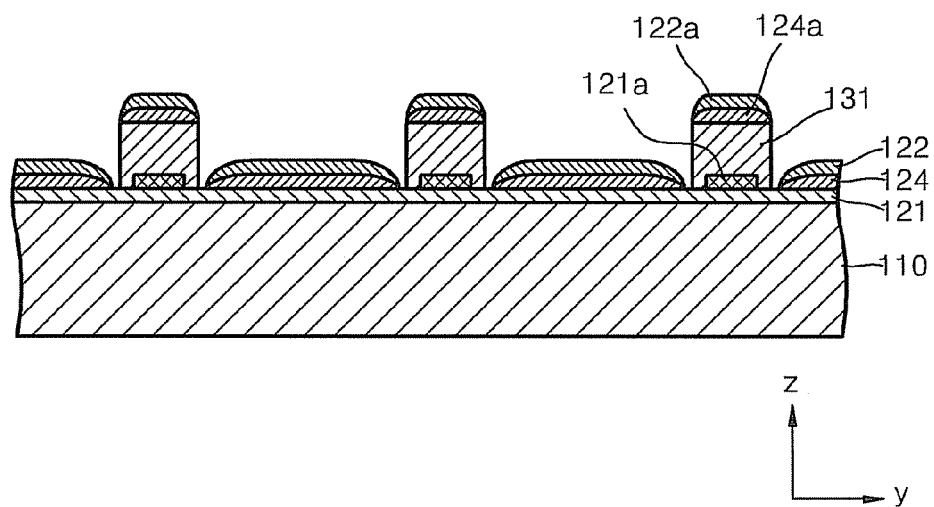
FIG. 3 is a schematic sectional view illustrating a portion of an organic light-emitting display device according to aspects of the present invention.
Figure 4:
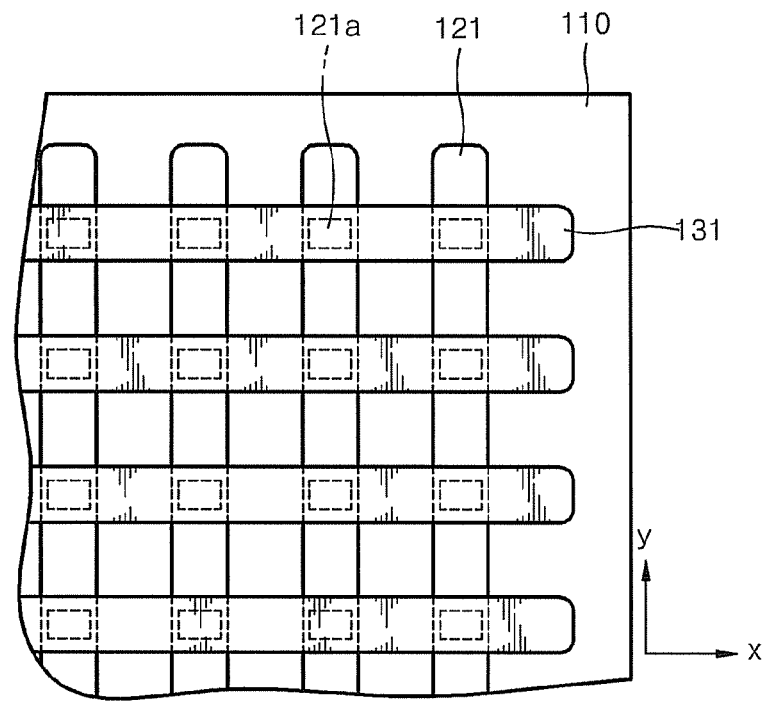
FIG. 4 is a schematic plan view illustrating a portion of the organic light-emitting display device of FIG. 3.

FIG. 3 is a schematic sectional view illustrating a portion of an organic light-emitting display device according to aspects of the present invention, and FIG. 4 is a schematic plan view illustrating the portion of the organic light-emitting display device illustrated in FIG. 3.

Referring to FIGS. 3 and 4, a plurality of first electrodes 121 having a stripe shape or elongated, strip shape and extending in a Y direction are disposed on a substrate 110. The substrate 110 can be formed of a transparent glass material or a plastic material such as acryl, polyimide, polyester, Mylar®, etc.

The first electrodes 121 are formed of a transparent conductive material through which light can be transmitted, such as ITO, IZO, ZnO or $In_2O_3$.

A plurality of first insulators 131, having a stripe shape or elongated, strip shape, are formed to extend in an X direction and to cross the first electrodes 121. The first insulators 131 can function as second electrode separators (31 of FIGS. 1 and 2) to allow for easy formation of the second electrodes 122 on the surface of an intermediate layer 124. Hereinafter, the first insulators 131 function as the second electrode separators as the first insulators 131 provide the stripe or elongated band shape of the second electrodes 122. FIG. 4 schematically shows a portion of the organic light-emitting display device according to aspects of the present invention including the first electrodes 121 and the first insulators 131 on the substrate 110.

Figure 2:
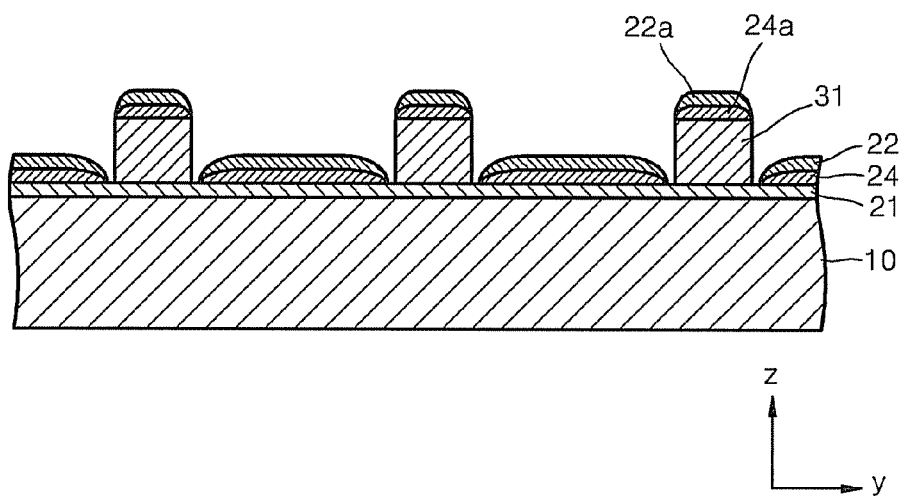
FIG. 2 is a schematic sectional view illustrating a portion of another conventional organic light-emitting display device.

When a conductive material is deposited on the entire surface of the substrate 110 to form second electrodes, a plurality of second electrodes 122 having a stripe shape or elongated, strip shape are formed to cross the first electrodes 121 by the first insulators 131 which separate the second electrodes 122 into long, elongated stripe shapes and act as second electrode separators (31 of FIGS. 1 and 2). Therefore, the second electrodes 122 are formed between the first insulators 131 illustrated in FIG. 4 and extend in the same direction as the first insulators 131, that is, the X direction. When depositing the conductive material on the entire surface of the substrate 110 to form the second electrodes 122, the conductive material is also deposited on the first insulators 131, which separate the second electrodes 122 into elongated, stripe shapes. Thus, as described in FIG. 3, second conductors 122a, which are formed of the same material as the second electrodes 122, can also be disposed on the second intermediate layer 124a and formed on the first insulators 131. It will be known to those of ordinary skill in the art that deposition of the conductive material on the entire surface of the substrate 110 to form the second electrodes 122 can also be performed using a mask so as to not form the conductive material on the first insulators 131.

The second electrodes 122 can be formed of a transparent conductive material or an opaque conductive material according to necessity. Transparent conductive materials such as ITO, IZO, ZnO or $In_2O_3$ can be used to form the second electrodes 122. When the second electrodes 122 are formed using an opaque conductive material, the structure can include a reflection membrane, which is formed of Ag, Mg, Al, Pt, Pd, Au, Ni, Nd, Ir, Cr, compounds thereof, etc., and an ITO, ZnO or $In_2O_3$ layer, which is formed on the reflection membrane.

Pixels or sub-pixels are formed where the first electrodes 121 and the second electrodes 122 intersect. For this, as described in FIG. 3, an intermediate layer 124 is disposed where the first electrodes 121 and the second electrodes 122 intersect, and the intermediate layer 124 includes at least one emission layer. The intermediate layer 124 receives holes and electrons from the first electrodes 121 and the second electrodes 122 which combine to generate light. As such, the intermediate layer 124 is disposed between the first and second electrodes 121 and 122 where the first and second electrodes 121 and 122 intersect.

The intermediate layer 124, which includes at least one emission layer and can be formed of an organic substance or an inorganic substance. The organic substance can be a small-molecular organic substance or a polymeric organic substance.

When using a small-molecular organic substance, the intermediate layer 124 can be a single layer or multi-layer structure including a hole injection layer, a hole transport layer, an emission layer, an electron transport layer, an electron injection layer, etc., where various organic materials such as copper phthalocyanine (CuPc), N,N'-Di(naphthalene-1-yl)-N,N'-diphenyl-benzidine (NPB), tris-8-hydroxyquinoline aluminium (Alq3), etc. can be used. The intermediate layer 124 can be formed using various methods, such as a deposition method.

When the intermediate layer 124 is formed of a polymeric organic substance, the intermediate layer 124 can usually have a structure including a hole transport layer and an emission layer, where PEDOT is used as a hole transport layer and a polymeric organic substance such as poly-phenylenevinylene (PPV) polymers or polyfluorene polymers can be used as an emission layer.

Meanwhile, when the electrical resistance of the first electrodes 121 is high, different electrical signals are applied to each sub-pixel connected to the first electrodes 121, depending upon the position of each sub-pixel. The different electrical signals applied to each sub-pixel are due to the IR drop across the first electrodes 121. As a result, the same electrical signal is not applied to each sub-pixel according to the position thereof. This causes deterioration in image quality, such as uneven brightness. In particular, the IR drop across the first electrodes 121 becomes increasingly problematic as the size and the brightness of the display are increased.

Therefore, in the organic light-emitting display device according to aspects of the present invention, the first conductors 121a, which are disposed where the first electrodes 121 and the first insulators 131 intersect, are included between the first electrodes 121 and the first insulators 131 so that the IR drop across the first electrodes 121 can be decreased or prevented. The first conductors 121a, which are formed of a material having low electrical resistance, are disposed in area outside the sub-pixels. As there is no light generated outside of the sub-pixels, the first conductors 121a do not need to be transparent. The first conductors 121a allow the organic light-emitting display device to display high-quality images on a large screen and with high brightness.

The first conductors 121a can be formed of Cr, Mg, Ag, Mo, MoW or Al. However, the first conductors are not limited thereto, and the first conductors 121a can be formed of other conductive materials having low electrical resistance.

The organic light-emitting display device can include a terminal unit (not shown) in or at the edges of the substrate 110. One side of the terminal unit is electrically connected to the first electrodes 121 or the second electrodes 122, and another side of the terminal unit is electrically connected to a printed circuit board (PCB) on which a controller IC, a drive IC, a jumper IC, etc are installed, and thus the terminal unit controls electric signals which are applied to the first electrodes 121 and the second electrodes 122. The controller IC and the like can be included on the substrate 110 without requiring the PCB.

The terminals of the terminal unit are formed of a conductive material; therefore the first conductors 121a and the terminals of the terminal unit can be formed in the same process. In such case, the terminals of the terminal unit are formed of the same material as the first conductors 121a.

Further, the terminals of the terminal unit can have a multi-layer structure including at least two layers, wherein a first layer and the first electrodes 121 can be formed in the same process and a second layer and the first conductors 121a can be formed in the same process. In such case, the terminals of the terminal unit include a layer which is formed of the same material as the first electrodes 121 and another layer which is formed of the same material as the first conductors 121a.

Likewise, the first conductors 121a can be formed at the same time as the terminals of the terminal unit. Accordingly, the performance of the organic light-emitting display device can be improved without additional processes or equipment.

Figure 5:
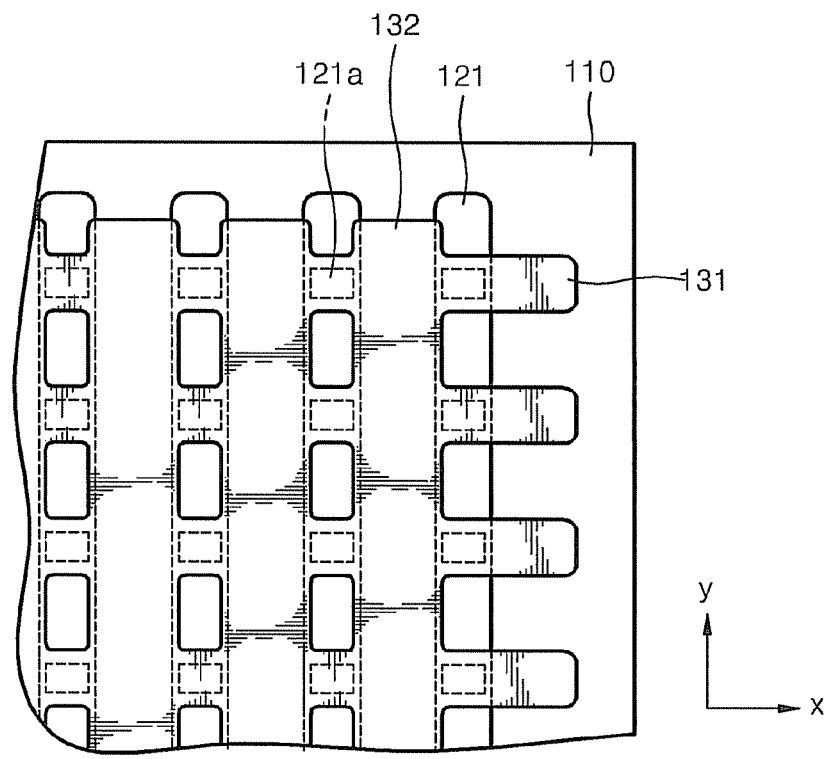
FIG. 5 is a schematic plan view illustrating a portion of an organic light-emitting display device according to aspects of the present invention.

FIG. 5 is a schematic plan view illustrating a portion of an organic light-emitting device according to aspects of the present invention. Like the depiction in FIG. 4, second electrodes and an intermediate layer are not illustrated in FIG. 5.

Referring to FIG. 5, a plurality of second insulators 132 can further be included between first electrodes 121. The second insulators 132 extend in the same direction, that is, a Y direction, in which the first electrodes 121 extend as illustrated in FIG. 5. In particular, in the organic light-emitting device illustrated in FIG. 5, first insulators 131 extending in an X direction and the second insulators 132 extending in the Y direction are integrally formed as one body, but the first and second insulators 131 and 132 are not limited thereto. Further, both the first and second insulators 131 and 132 may be formed to a height extending away from the surface of the substrate 110, or one or both of the first and second insulators 131 and 132 may be formed as having a stripe or elongated, strip shape.

In the structure as illustrated in FIG. 5, pixels or sub-pixels are formed at each point of the first electrodes 121 not covered by the first insulators 131 or the second insulators 132. In this case also, first conductors 121a can be formed at positions where the first electrodes 121 and the first insulators 131 intersect so that an IR drop across the first electrodes 121 can be prevented. As such, the first electrodes 121 are disposed to extend across a surface of a substrate 110. The first insulators 131 are disposed on the surface of the substrate 110 and formed to cross the first electrodes 121. Further, the second insulators 132 are formed between adjacent first electrodes 121 and therefore have an elongated strip shape. The intermediate layer 124 and the second electrodes 122 are formed to cross the first electrodes 121 between the first insulators. As such, the second electrodes 122 have an elongated, stripe shape. Pixels are formed at the intersection of the first and second electrodes 121 and 122 in which neither the first nor the second insulators are formed. Further, the first conductors 121a are disposed on the first electrodes 121, covered by the first insulators 131, and formed between the pixels.

Figure 6:
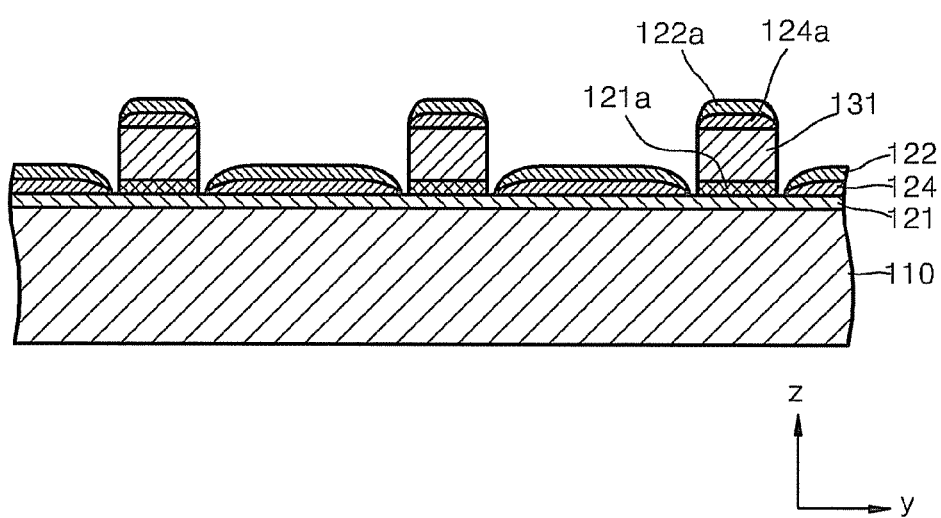
FIG. 6 is a schematic plan view illustrating a portion of an organic light-emitting display device according to aspects of the present invention.

FIG. 6 is a schematic sectional view illustrating a portion of an organic light-emitting display device according to aspects of the present invention. While the organic light-emitting display devices according to aspects of the present invention have a structure in which the first insulators 131 cover the first conductors 121a as illustrated in FIGS. 3 and 4, referring to FIG. 6, the end surfaces of first conductors 121a may not be covered with first insulators 131 but may be exposed. As such, the first conductors 121a are formed on the first electrodes 121, and the first insulators are formed to cross the first electrodes 121 at the first conductors 121a. And, the first insulators 131 cover, but not entirely, the first conductors 121a. Further, second conductors 122a, which are formed of the same material as the second electrodes 122, can also be disposed on the second intermediate layer 124a and formed on the first insulators 131.

However, the organic light-emitting display device is not limited to the above descriptions. For example, the second electrodes 122 of FIG. 3 may also comprise conductors disposed thereon to decrease the resistance and IR drop along the length of the second electrodes and increase display quality of the organic light-emitting display device. Further, the conductors disposed on the second electrodes 122 may be located in non-pixel areas between adjacent pixels along the length of the second electrodes 122.

Effects of the organic light-emitting display device according to aspects of the present invention are described below.

First, an IR drop across first electrodes can be prevented and thus the performance of the organic light-emitting display device can be largely improved by forming conductors having low electric resistance in outer spaces of each pixel or sub-pixel on the first electrodes.

Second, the performance of the organic light-emitting display device can be largely improved without additional processing by forming the conductors, which prevent an IR drop across the first electrodes, at the same time as forming terminals of a terminal unit and the like.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light-emitting display device comprising:
   a substrate;
   first electrodes disposed on the substrate and extending in a first direction;
   first insulators extending in a second direction to cross the first electrodes;
   second electrodes disposed between the first insulators to extend in the same direction as the first insulators and to cross the first electrodes;
   an intermediate layer comprising an emission layer is disposed between the first electrodes and the second electrodes where the first electrodes and the second electrodes cross; and
   first conductors disposed at positions where the first electrodes and the first insulators cross and disposed between the first electrodes and the first insulators.

2. The organic light-emitting display device of claim 1, wherein the first conductors are formed of Cr, Mg, Ag, Mo, MoW or Al.

3. The organic light-emitting display device of claim 1, further comprising:
a terminal unit on edges of the substrate.

4. The organic light-emitting display device of claim 3, wherein terminals of the terminal unit are formed of the same material as the first conductors.

5. The organic light-emitting display device of claim 3, wherein the terminals of the terminal unit have a multi-layer structure comprising at least two layers.

6. The organic light-emitting display device of claim 5, wherein the terminals of the terminal unit comprise a first layer which is formed of the same material as the first electrodes and a second layer which is formed of the same material as the first conductors.

7. The organic light-emitting display device of claim 1, wherein the first insulators are formed so as to cover the first conductors.

8. The organic light-emitting display device of claim 1, further comprising
second insulators disposed between the first electrodes.

9. The organic light-emitting display device of claim 8, wherein the first insulators and the second insulators are integrally formed.

10. The organic light-emitting display device of claim 1, wherein the first electrodes are transparent.

11. The organic light-emitting display device of claim 10, wherein the first electrodes are formed of ITO, IZO, ZnO or $In_2O_3$.

12. The organic light-emitting display device of claim 1, further comprising
second conductors disposed on the first insulators,
wherein the second conductors are formed of the same material as the second electrodes.

13. The organic light-emitting display device of claim 1, wherein the first and second electrodes and the first insulators have a stripe shape or an elongated, strip shape.

14. An organic light-emitting display device, comprising:
a substrate;
first electrodes disposed on the substrate to extend in a first direction;
second electrodes disposed on the substrate to extend in a second direction and to cross the first electrodes;
an intermediate layer disposed at least between the first and second electrodes at locations in which the first and second electrodes cross; and
first conductors disposed on the first electrodes at locations in which the first and second electrodes do not cross.

15. The organic light-emitting display device of claim 14, further comprising:
second conductors disposed on the second electrodes at locations in which the first and second electrodes do not cross.

16. The organic light-emitting display device of claim 14, further comprising:
insulators disposed between the first electrodes.

17. The organic light-emitting display device of claim 14, further comprising:
insulators disposed between the second electrodes.

18. An organic light-emitting display device, comprising:
a substrate;
first electrodes disposed on the substrate to extend in a first direction;
first insulators disposed to cross the first electrodes in a second direction;
first conductors disposed between the first electrodes and the first insulators in locations in which the first electrodes and the first insulators cross;
an intermediate layer disposed between adjacent first insulators and on the first insulators; and
second electrodes disposed on the intermediate layer.

19. The organic light-emitting display device of claim 18, further comprising:
second insulators disposed between adjacent first electrodes and disposed between the substrate and the intermediate layer or the intermediate layer and the second electrodes.

20. The organic light-emitting display device of claim 18, further comprising:
second conductors disposed on the second electrodes at locations in which the first and second electrodes do not cross.

* * * * *